United States Patent
Rocha-Alvarez et al.

(10) Patent No.: US 11,004,663 B2
(45) Date of Patent: May 11, 2021

(54) CHAMBER DESIGN FOR SEMICONDUCTOR PROCESSING

(71) Applicant: Applied Materials, Inc., Santa Clara, CA (US)

(72) Inventors: Juan Carlos Rocha-Alvarez, San Carlos, CA (US); Dale R. Du Bois, Los Gatos, CA (US); Amit Kumar Bansal, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 936 days.

(21) Appl. No.: 14/766,666

(22) PCT Filed: Mar. 6, 2014

(86) PCT No.: PCT/US2014/021358
§ 371 (c)(1),
(2) Date: Aug. 7, 2015

(87) PCT Pub. No.: WO2014/149883
PCT Pub. Date: Sep. 25, 2014

(65) Prior Publication Data
US 2015/0380217 A1 Dec. 31, 2015

Related U.S. Application Data (60) Provisional application No. 61/798,024, filed on Mar. 15, 2013.

(51) Int. Cl.
*H01J 37/32* (2006.01)
*C23C 16/455* (2006.01)
(Continued)

(52) U.S. Cl.
CPC .. *H01J 37/32458* (2013.01); *C23C 16/45587* (2013.01); *C23C 16/46* (2013.01);
(Continued)

(58) Field of Classification Search
CPC ................................................ H01J 37/32458
See application file for complete search history.

(56) References Cited

U.S. PATENT DOCUMENTS 5,906,683 A * 5/1999 Chen ................... C23C 16/455
118/715
6,050,446 A * 4/2000 Lei .................... H01L 21/67017
220/264

(Continued)

FOREIGN PATENT DOCUMENTS

KR 20-19990037189 A 5/1999
KR 1020050108700 A 11/2005
(Continued)

OTHER PUBLICATIONS

International Search Report and Written Opinion, PCT/US2014/021358, dated Jun. 26, 2014.
(Continued)

*Primary Examiner* — Parviz Hassanzadeh
*Assistant Examiner* — Nathan K Ford
(74) *Attorney, Agent, or Firm* — Patterson + Sheridan, LLP (57) ABSTRACT

Embodiments described herein provide an apparatus for improving deposition uniformity by improving plasma profile using a tri-cut chamber liner. The apparatus also includes a lid assembly having a split process stack for reducing downtime and a bottom heater support for more efficient heating of chamber walls.

14 Claims, 6 Drawing Sheets

(51) Int. Cl.
  *C23C 16/46* (2006.01)
  *C23C 16/50* (2006.01)
  *C23C 16/54* (2006.01)
  *C23C 16/505* (2006.01)

(52) U.S. Cl.
  CPC ............ *C23C 16/50* (2013.01); *C23C 16/505* (2013.01); *C23C 16/54* (2013.01); *H01J 37/3288* (2013.01); *H01J 37/32449* (2013.01); *H01J 2237/3321* (2013.01)

(56) References Cited

U.S. PATENT DOCUMENTS

| | | | |
|---|---|---|---|
| 2003/0017268 A1* | 1/2003 | Hu | C23C 16/34 427/255.391 |
| 2003/0155076 A1* | 8/2003 | Murakami | C23C 16/54 156/345.31 |
| 2003/0176074 A1* | 9/2003 | Paterson | H01J 37/32082 438/710 |
| 2003/0209097 A1 | 11/2003 | Hunter | |
| 2003/0221780 A1 | 12/2003 | Lei et al. | |
| 2005/0205110 A1* | 9/2005 | Kao | H01J 37/32082 134/1.1 |
| 2012/0018402 A1* | 1/2012 | Carducci | H01J 37/32082 216/67 |
| 2012/0031559 A1* | 2/2012 | Dhindsa | H01J 37/32091 156/345.26 |
| 2013/0146103 A1* | 6/2013 | Kahlon | H01L 21/67034 134/31 |

FOREIGN PATENT DOCUMENTS

| KR | 100715984 B1 | 5/2007 |
|---|---|---|
| KR | 10-20090015378 A | 2/2009 |
| KR | 1020110061188 A | 6/2011 |

OTHER PUBLICATIONS

Taiwanese Office Action (with attached English translation) for Application No. 106137718; dated Mar. 7, 2019; 7 total pages.

Korean Office Action for Application No. KR 10-2015-7026258 dated May 11, 2020.

* cited by examiner

CHAMBER DESIGN FOR SEMICONDUCTOR PROCESSING

BACKGROUND

Field

Embodiments of the present invention generally relate to an apparatus and method for processing substrates. More particularly, embodiments of the present invention relate to a plasma processing chamber used for dielectric deposition.

Description of the Related Art

Plasma processing, such as plasma enhanced chemical vapor deposition (PECVD), is used to deposit materials, such as blanket dielectric films on substrates, such as semiconductor wafers. A challenge for current plasma processing chambers and processes includes controlling deposition uniformity. A particular challenge includes asymmetries in process volume related to pumping and slit valve geometries and long planned maintenance (PM) downtime exceeding eight hours.

Accordingly, there is a need for an apparatus and process for improving uniformity and reducing PM downtime.

SUMMARY

Embodiments described herein provide an apparatus for improving deposition uniformity by improving plasma profile using a tri-cut chamber liner. The apparatus also includes a lid assembly having a split process stack for reducing downtime and a bottom heater support for more efficient heating of chamber walls.

In one embodiment, a PECVD process chamber is disclosed. The PECVD process chamber includes a chamber body supporting one or more chamber liners and first portions of one or more split process stacks. The PECVD process chamber further includes a lid assembly disposed above the chamber body. The lid assembly includes a lid cover supporting second portions of one or more split process stacks. The PECVD process chamber further includes a lift mechanism comprising cylinders for connecting the chamber body and the lid assembly.

In another embodiment, a PECVD process chamber is disclosed. The PECVD process chamber includes a chamber body having a slit valve opening and a process liner disposed in the chamber body. The process liner has three symmetrical openings and one of the openings is aligned with the slit valve opening.

In another embodiment, a PECVD process chamber is disclosed. The PECVD process chamber includes a bottom wall and a side wall, a metal heater plate disposed over the bottom wall, and a bottom plate disposed between the metal heater plate and the bottom wall. Gaps are formed between the metal heater plate and the bottom plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide an apparatus for improving deposition uniformity by improving plasma profile using a tri-cut chamber liner. The apparatus also includes a lid assembly having a split process stack for reducing downtime and a bottom heater support for more efficient heating of chamber walls.

Figure 1:
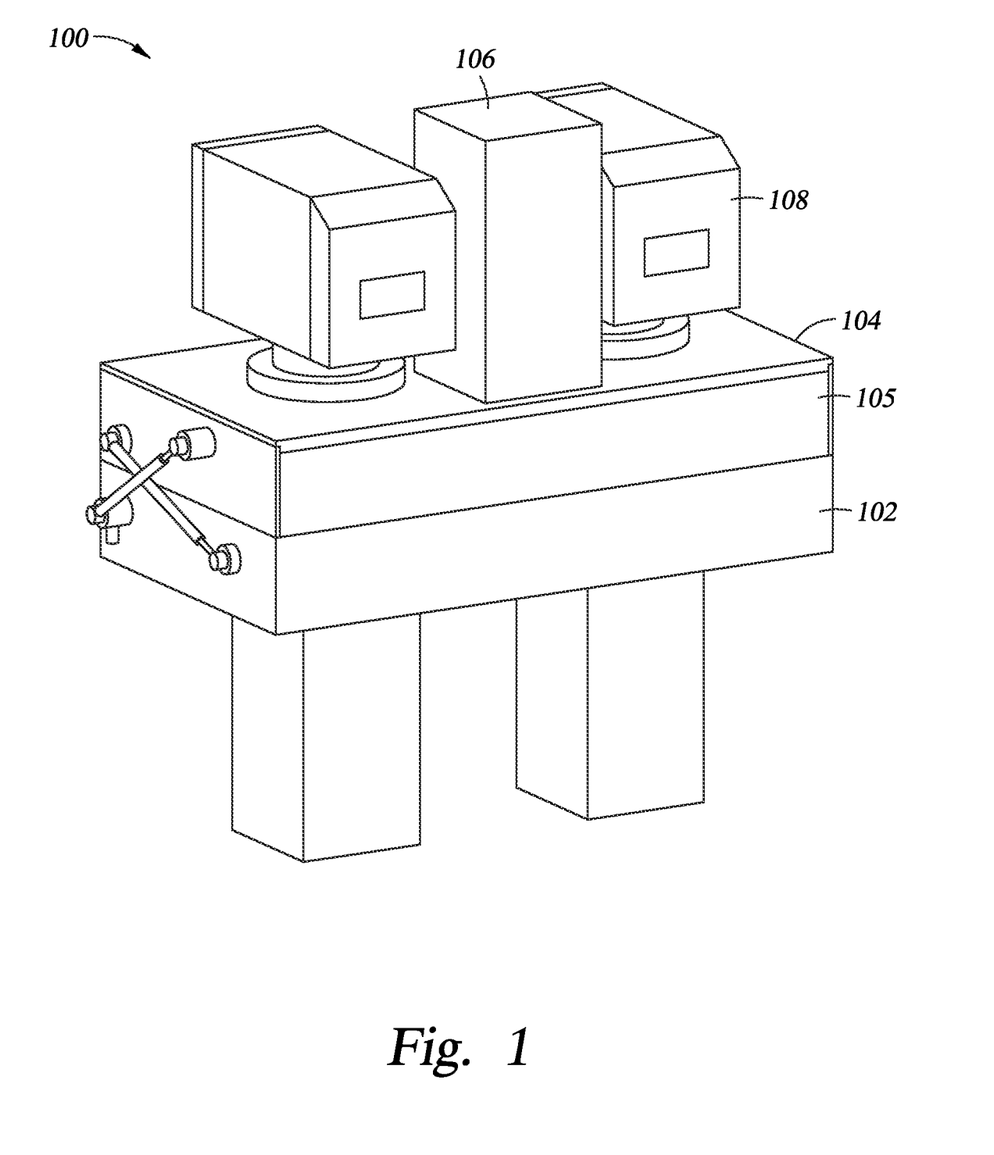
FIG. 1 is an isometric view of a process chamber according to various embodiments of the invention.

FIG. 1 is an isometric view of a process chamber 100 according to various embodiments of the invention. The process chamber 100 may be a plasma enhanced chemical vapor deposition (PECVD) chamber. An example of such a chamber that would benefit from improvement described herein is a dual or twin chamber on a PRODUCER® GT system, available from Applied Materials, Inc. of Santa Clara, Calif. The twin chamber has two isolated processing regions (for processing two substrates, one substrate per processing region) such that the flow rates experienced in each region are approximately one half of the flow rates into the whole chamber. The process chamber 100 has a chamber body 102 enclosing a process region and a lid assembly 104 disposed above the process region. The lid assembly 104 includes a lid cover 106 covering two split process stacks (see FIGS. 3 and 4) disposed over the chamber body 102. A dual automatch 106 and two remote plasma source 108 are disposed over the lid assembly 104.

Figure 2:
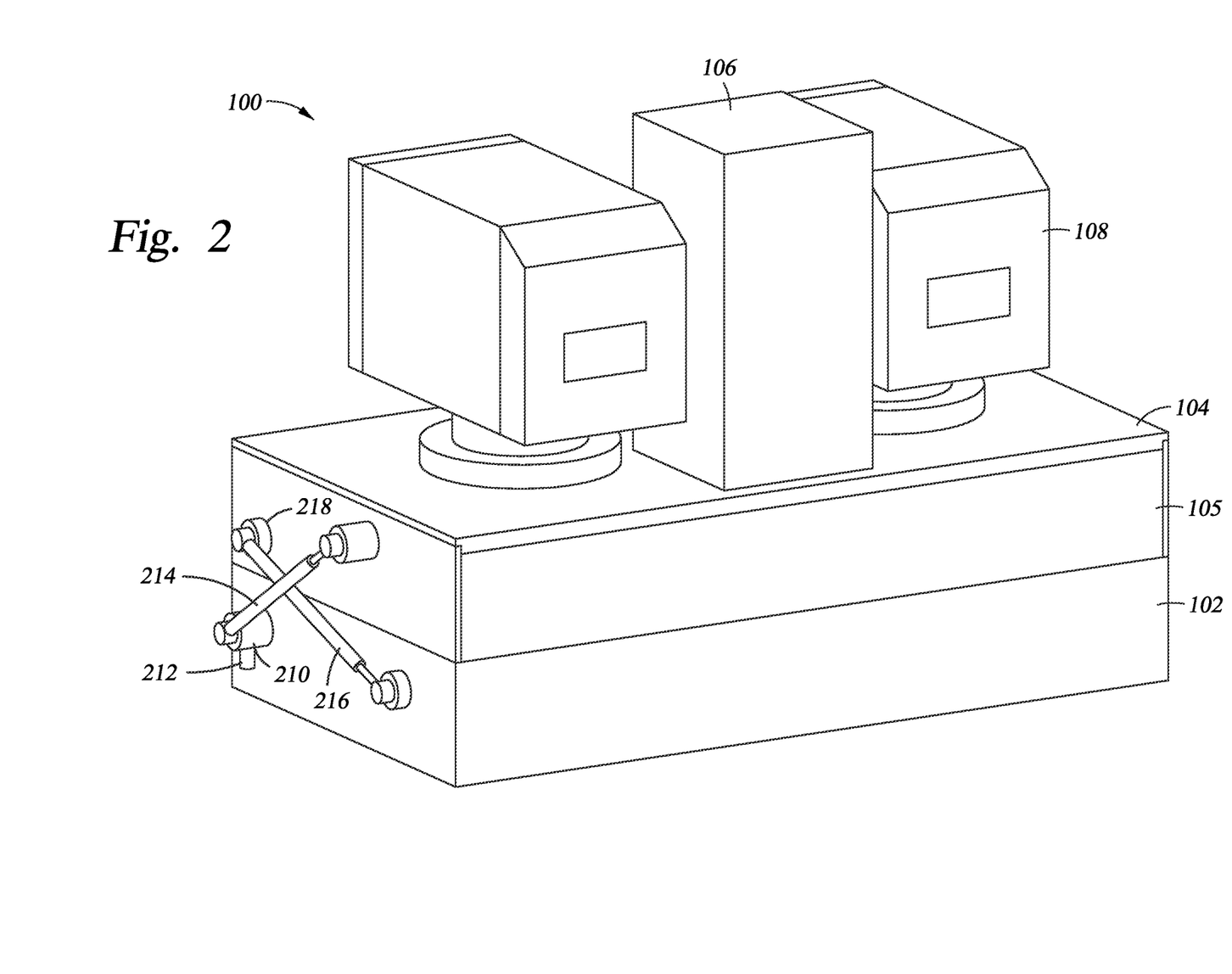
FIG. 2 is an isometric view of a top portion of the process chamber in FIG. 1 according to one embodiment of the invention.

FIG. 2 is an isometric view of a top portion of the process chamber 100 in FIG. 1 according to one embodiment of the invention. A bracket 210 is coupled to the chamber body 102 and pivotally coupled to the lid cover 105. The bracket 210 has a hinge pin 212 disposed therein. The bracket 210 and the hinge pin 212 are configured so the lid cover 105 has two vertical positions. At the first position, which is higher than the second position, the lid cover 105 is not resting on the chamber body 102 and there is a small gap between the lid cover 105 and the chamber body 102. As a vacuum is drawn in the lid assembly 104, the lid cover 105 drops to the second position, which closes the gap between the lid cover 104 and the chamber body 102, making the lid assembly 104 air tight. Seals such as o-rings are disposed inside the lid assembly 104 to prevent leaks. As a vacuum is drawn inside the lid assembly 104, the o-rings compress as the lid cover 105 drops to the second position. When the lid assembly 104 is vent to atmospheric condition, the o-rings decompress, lifting the lid cover 105 to the first position.

A lift mechanism having a first cylinder 214 and a second cylinder 216 on each side of the lid assembly 104 provide support for the lid cover 105 and facilitate opening and closing of the lid cover 105. The cylinders 214, 216 may be hydraulic or pneumatic. The first cylinder 214 is pivotally coupled to the bracket 210 and the lid cover 105. The second cylinder 216 is pivotally coupled to the chamber body 102 and a member 218, which is pivotally coupled to the lid cover 105.

Figure 3:
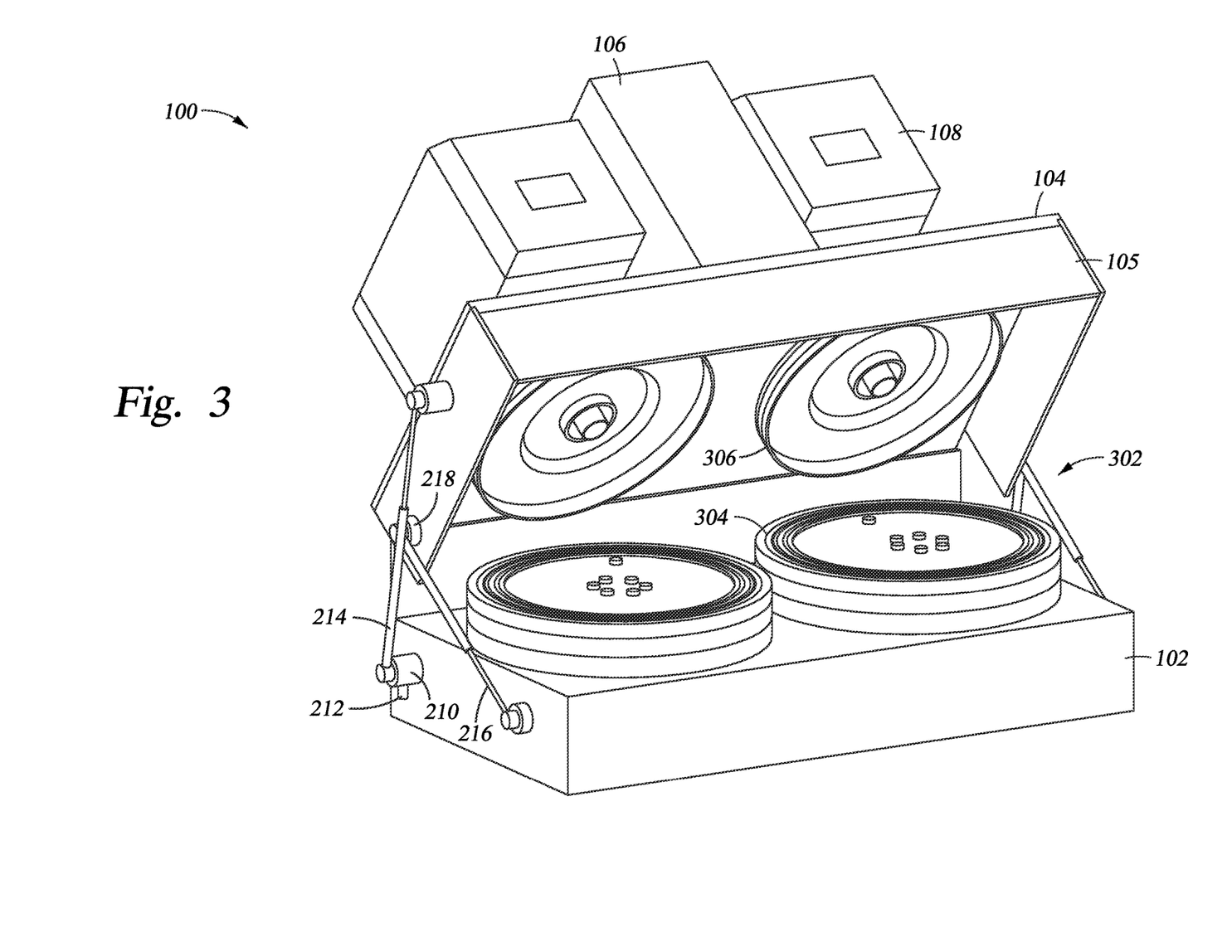
FIG. 3 is an isometric view of the top portion of the process chamber in FIG. 2 at an open position according to one embodiment of the invention.

FIG. 3 is an isometric view of the top portion of the process chamber 100 in FIG. 2 at an open position according to one embodiment of the invention. As shown in FIG. 3, the lid cover 105 is opened at an angle that is about 55 degrees. Both cylinders 214, 216 are extended, helping support the weight of the lid cover 105 and preventing the lid cover 105 from closing. Inside the lid cover 105, two split process stacks 302 are disposed above the chamber body 102 when the lid cover 105 is closed. A top portion 306 of the process stack 302 is coupled to the lid cover 105, so as the lid cover 105 opens, a bottom portion 304 of the split process stack 302 is exposed. The split process stack 302 provides easy access to the plates in the process stack 302, which leads to a shorter downtime for PM.

Figure 4:
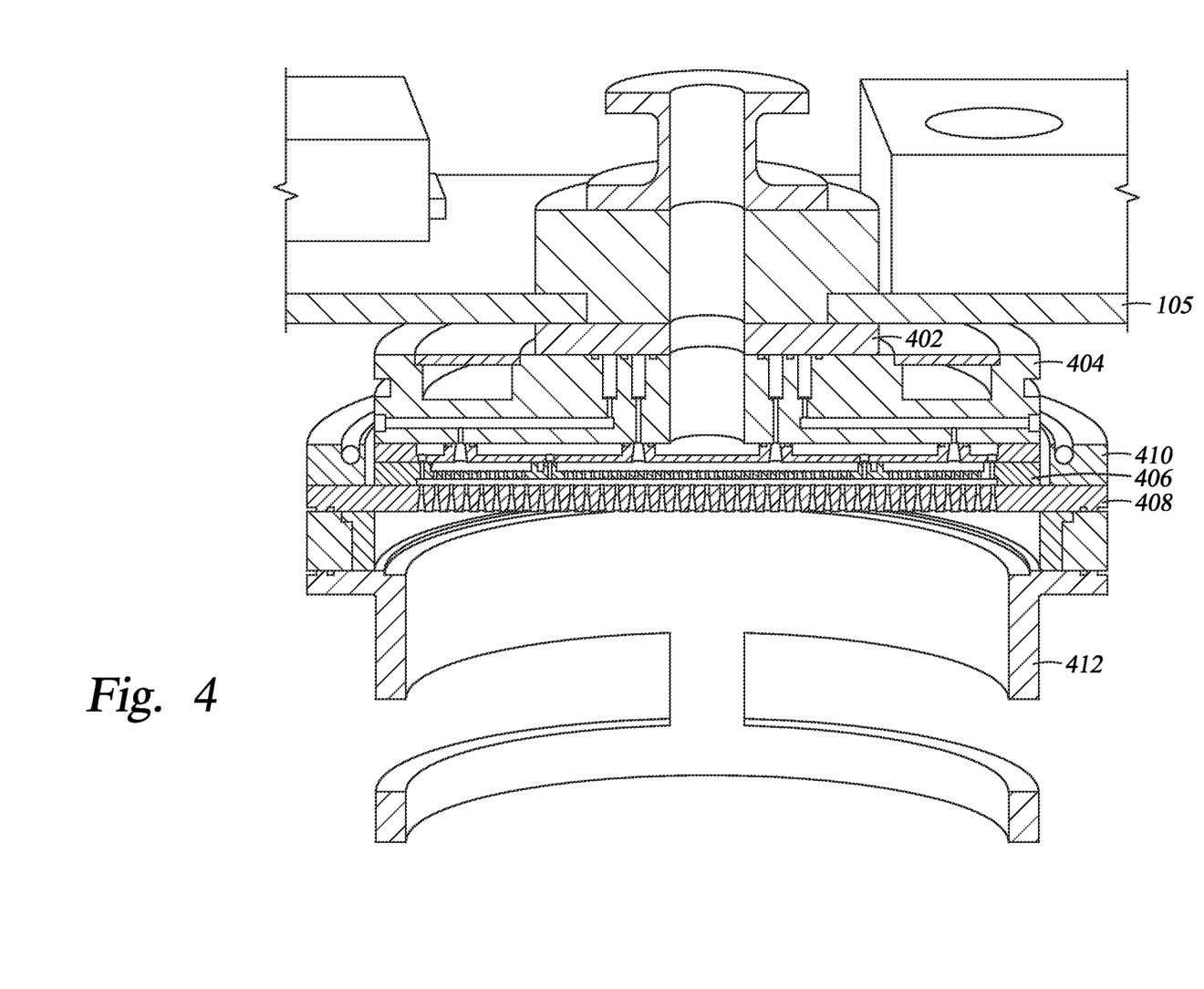
FIG. 4 is a cross sectional view of a split process stack according to one embodiment of the invention.

FIG. 4 is a cross sectional view of the process stack 302 according to one embodiment of the invention. The process stack 302 includes an isolator 402, a gas box 404, a dual channel blocker plate 406, a faceplate 408, and a faceplate heater 410. When the lid cover 105 is closed, the plates of the process stack 302 are aligned to allow process gas or remote plasma entering into the chamber body 102 below. The process stack 302 provides channels for multi-zoned gas/plasma entrance. As the lid cover 105 opens, the isolator 402 and the gas box 404 are split from the rest of the process stack 302 since the isolator 402 and the gas box 404 are coupled to the lid cover 105. The dual channel blocker plate 406 and the faceplate heater 410 are exposed when the lid cover 105 is opened.

As shown in FIG. 4, a tri-cut chamber liner 412 is disposed inside the chamber body 102. During a PECVD process, the deposition uniformity may be affected by plasma density profile. Conventionally, a chamber liner is disposed inside the chamber body 102 for providing an RF return path. The conventional chamber liner has one opening that is aligned with the slit valve opening for transferring substrates into and out of the process chamber. The opening in the conventional chamber liner causes the RF return path to be asymmetric, leading to an uneven plasma density profile.

Figure 5:
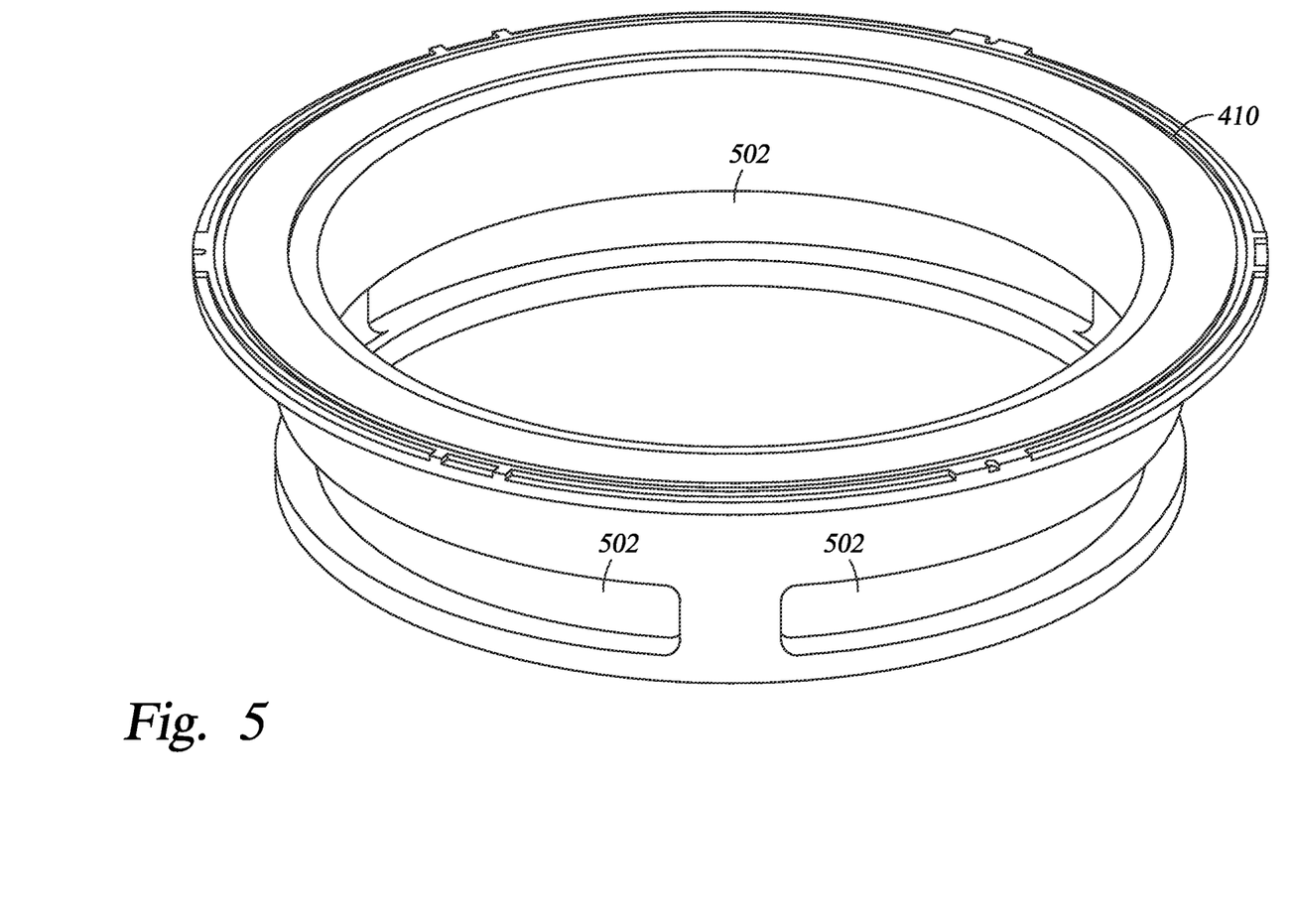
FIG. 5 is an isometric view of a tri-cut chamber liner according to one embodiment of the invention.

The tri-cut chamber liner 412 has three identical openings 502, as shown in FIG. 5. One of the openings is aligned with a slit valve opening 601 for transferring substrates into and out of the process chamber. The remaining two openings are "dummy openings". Because of the three openings 502, the tri-cut chamber liner 412 has a symmetrical geometry, leading to a symmetrical RF return path. In turn, the plasma density profile is improved and the deposition is more uniform.

Figure 6:
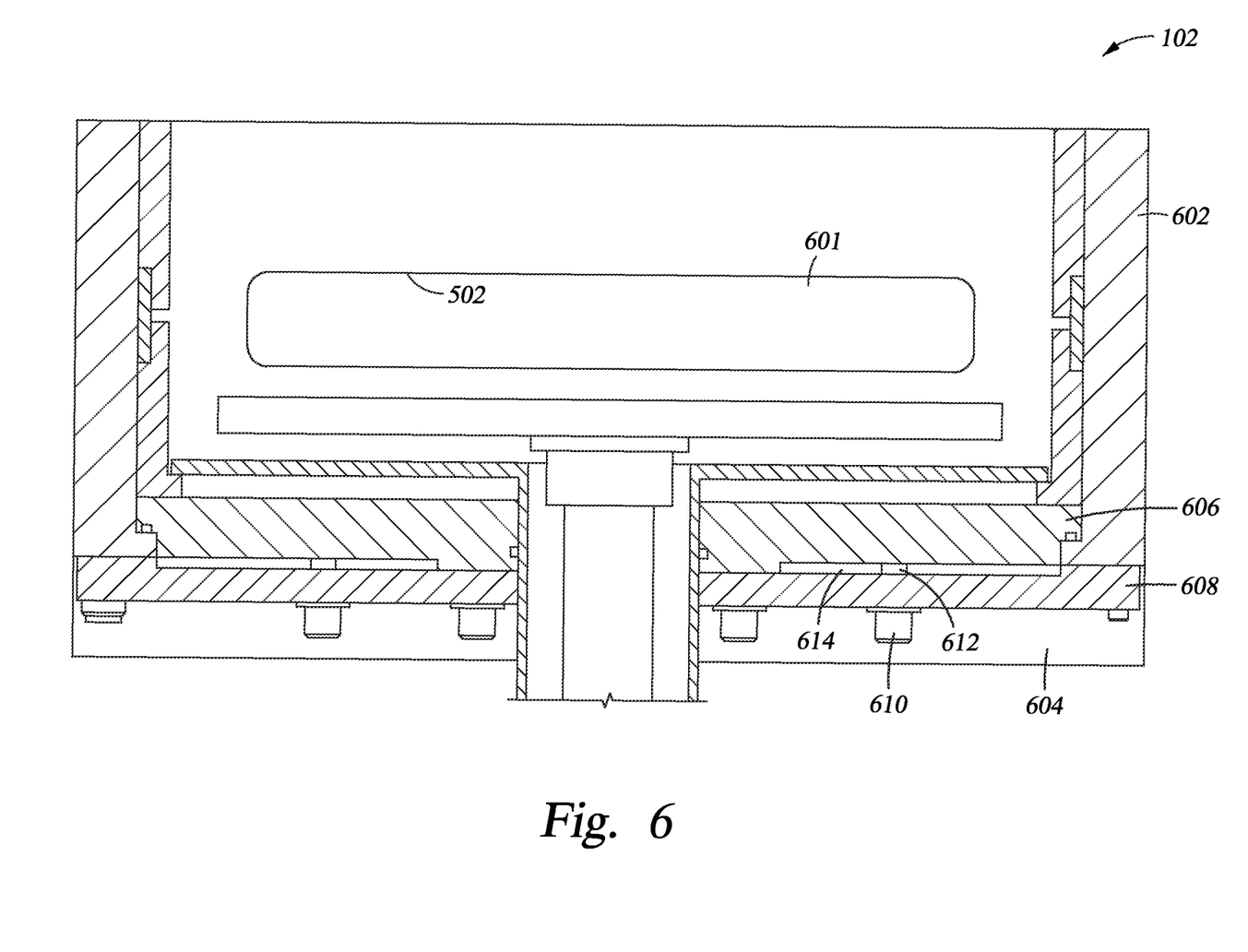
FIG. 6 is a cross sectional view of a chamber body of the process chamber in FIG. 1 showing a bottom heater according to one embodiment of the invention.

FIG. 6 is a cross sectional view of the chamber body 102 according to one embodiment of the invention. Again the tri-cut chamber liner 412 has one of the openings 502 aligned with the slit valve opening 601. The chamber body 102 has a side wall 602 and a bottom 604. A heater plate 606 is disposed over the bottom 604. During operation, the heater plate 606 heats the bottom 604 and the side wall 602 to a sufficient temperature to prevent condensation on the side wall 602 and the bottom 604. The heater plate 606 may have fluid channels inside for flowing a heating fluid or may have a resistive heating element embedded therein.

The bottom 604 and the side wall 602 are typically made of aluminum, which has a high thermal conductivity. To provide more efficient heating, a bottom plate 608 is disposed between the heater plate 606 and the bottom 604. The bottom plate 608 may be made of a metal having low thermal conductivity, such as stainless steel. To further reduce the heat loss, the heater plate 606 has minimum contact with the bottom plate 608 and the side wall 602 sufficient for structural support. O-rings 612 are disposed between the heater plate 606 and the bottom plate 608 to form gaps 614. The edges of the bottom plate 608 extend into the side wall 602 to prevent lifting of the bottom plate 608 into the process region of the chamber by the vacuum process condition. In addition, the bottom plate 608 is also coupled to the bottom 604 by fastening devices 610. The bottom plate 608 may have channels inside for flowing a cooling fluid to prevent the bottom 604 from burning operators during PM.

In summary, an improved PECVD process chamber is provided for more uniform deposition, more efficient heating of the chamber walls and less downtime for PM.

While the foregoing is directed to embodiments of the present invention, other and further embodiments of the invention may be devised without departing from the basic scope thereof, and the scope thereof is determined by the claims that follow.

The invention claimed is:

1. A PECVD process chamber, comprising:
    a chamber body; and
    a lid assembly disposed above the chamber body, the lid assembly comprising:
        one or more split process stacks disposed over the chamber body, wherein the one or more split process stacks each comprises a first portion including a blocker plate, a faceplate, and a faceplate heater, and a second portion including an isolator and a gas box, wherein the first portion is disposed over the chamber body and the second portion is disposed over and contactable with the first portion;
        a lid cover disposed over the one or more split process stacks and coupled to the second portion of each split process stack; and
        a lift mechanism comprising a first cylinder coupled to each of the lid cover and the chamber body, and a second cylinder coupled to each of the lid cover and the chamber body, wherein the lift mechanism is configured to lift the lid cover, the isolator, and the gas box simultaneously relative to the chamber body to separate the first portion of each split process stack from the second portion of each split process stack, and wherein the blocker plate and the faceplate heater are exposed when the first portion and the second portion are separated by the lift mechanism.

2. The PECVD process chamber of claim 1, wherein the one or more split process stacks include two split process stacks.

3. The PECVD process chamber of claim 1, wherein the first cylinder and the second cylinder are hydraulic.

4. The PECVD process chamber of claim 1, wherein the first cylinder and the second cylinder are pneumatic.

5. The PECVD process chamber of claim 1, wherein the chamber body has a slit valve opening.

6. The PECVD process chamber of claim 5, further comprising one or more chamber liners disposed in the chamber body, wherein the one or more chamber liners each comprise a process liner comprising three symmetrical openings.

7. The PECVD process chamber of claim 6, wherein one of the three symmetrical openings is aligned with the slit valve opening.

8. The PECVD process chamber of claim 5, wherein the chamber body comprises a side wall and a bottom wall.

9. The PECVD process chamber of claim 8, further comprising a metal heater plate disposed over the bottom wall.

10. The PECVD process chamber of claim 9, further comprising a bottom plate disposed between the metal heater plate and the bottom wall, wherein gaps are formed between the metal heater plate and the bottom plate.

11. The PECVD process chamber of claim 1, wherein the chamber body comprises a side wall and a bottom wall.

12. The PECVD process chamber of claim 11, further comprising a metal heater plate disposed over the bottom wall.

13. The PECVD process chamber of claim 12, further comprising a bottom plate disposed between the metal heater plate and the bottom wall, wherein gaps are formed between the metal heater plate and the bottom plate.

14. The PECVD process chamber of claim 1, wherein the lid assembly comprises a remote plasma source disposed thereon.

* * * * *